(12) United States Patent
Lai et al.

(10) Patent No.: US 10,910,518 B2
(45) Date of Patent: Feb. 2, 2021

(54) SEMICONDUCTOR DEVICE

(71) Applicant: EPISTAR CORPORATION, Hsinchu (TW)

(72) Inventors: Huan-Yu Lai, Hsinchu (TW); Li-Chi Peng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/929,614

(22) Filed: May 13, 2020

(65) Prior Publication Data

US 2020/0274028 A1    Aug. 27, 2020

Related U.S. Application Data

(63) Continuation of application No. 16/182,919, filed on Nov. 7, 2018, now Pat. No. 10,693,038.

(51) Int. Cl.
| | | |
|---|---|---|
| *H01L 33/14* | (2010.01) | |
| *H01L 33/32* | (2010.01) | |
| *H01L 33/06* | (2010.01) | |
| *H01L 33/30* | (2010.01) | |
| *H01L 33/00* | (2010.01) | |
| *H01L 33/04* | (2010.01) | |

(52) U.S. Cl.
CPC ........ *H01L 33/145* (2013.01); *H01L 33/0062* (2013.01); *H01L 33/04* (2013.01); *H01L 33/06* (2013.01); *H01L 33/14* (2013.01); *H01L 33/30* (2013.01); *H01L 33/305* (2013.01); *H01L 33/32* (2013.01); *H01L 33/325* (2013.01)

(58) Field of Classification Search
CPC ....... H01L 33/32; H01L 33/325; H01L 33/30; H01L 33/305; H01L 33/14; H01L 33/145; H01L 33/0062; H01L 33/04; H01L 33/06
See application file for complete search history.

(56) References Cited

U.S. PATENT DOCUMENTS

| | | | |
|---|---|---|---|
| 6,046,464 | A | 4/2000 | Schetzina |
| 2002/0195619 | A1 | 12/2002 | Makimoto et al. |
| 2004/0245535 | A1 | 12/2004 | D'Evelyn et al. |
| 2007/0096077 | A1 | 5/2007 | Sanga et al. |
| 2009/0078944 | A1 | 3/2009 | Kubota et al. |
| 2010/0176372 | A1 | 7/2010 | Yoo et al. |
| 2011/0073888 | A1* | 3/2011 | Ueno ............ H01L 33/32 257/94 |
| 2012/0112203 | A1 | 5/2012 | Enya et al. |
| 2013/0285066 | A1 | 10/2013 | Sumitomo et al. |
| 2016/0056338 | A1 | 2/2016 | Park et al. |

* cited by examiner

*Primary Examiner* — Feifei Yeung Lopez

(57) ABSTRACT

A semiconductor device is provided. The semiconductor device includes a first semiconductor layer; a second semiconductor layer on the first semiconductor layer; an active region between the second semiconductor layer and the first semiconductor layer; an electron blocking structure between the active region and the second semiconductor layer; a first In-containing layer between the active region and the electron blocking structure; and a second In-containing layer between the electron blocking structure and the second semiconductor layer; wherein the first In-containing layer and the second In-containing layer each includes indium, aluminum and gallium, the first In-containing layer has a first aluminum content, the second In-containing layer has a second aluminum content, and the second aluminum content is less than the first aluminum content.

20 Claims, 2 Drawing Sheets

SEMICONDUCTOR DEVICE

CROSS REFERENCE TO RELATED APPLICATIONS

This application is a continuation of U.S. patent application Ser. No. 16/182,919, filed Nov. 7, 2018, which claims priority to and the benefit of U.S. provisional application No. 62/590,040, filed on Nov. 22, 2017, each of which is incorporated by reference herein in its entirety.

TECHNICAL FIELD

The disclosure relates to a semiconductor device, and particularly to a semiconductor device including an In-containing layer.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a semiconductor device. The semiconductor device includes a first semiconductor layer; a second semiconductor layer on the first semiconductor layer; an active region between the second semiconductor layer and the first semiconductor layer; an electron blocking structure between the active region and the second semiconductor layer; a first In-containing layer between the active region and the electron blocking structure; and a second In-containing layer between the electron blocking structure and the second semiconductor layer; wherein the first In-containing layer and the second In-containing layer each includes indium, aluminum and gallium, the first In-containing layer has a first aluminum content, the second In-containing layer has a second aluminum content, and the second aluminum content is less than the first aluminum content.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
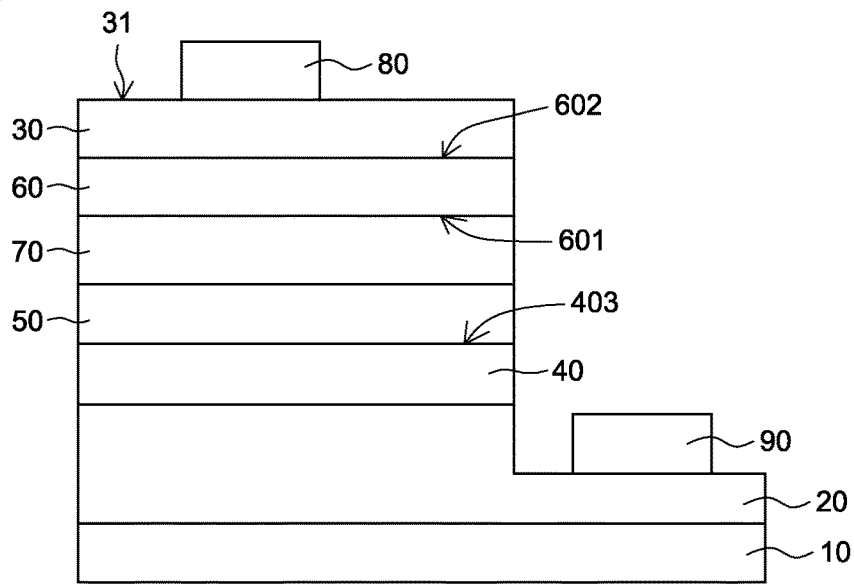
FIG. 1 is a schematic cross-sectional diagram of a first embodiment of a semiconductor device.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaN means $Al_{x1}Ga_{(1-x1)}N$, wherein $0 \le x1 \le 1$; the general expression of InGaN means $In_{x2}Ga_{1-x2}N$, wherein $0 \le x2 \le 1$; the general expression of InAlGaN means $In_{x3}Al_{y1}Ga_{1-x3-y1}N$, wherein $0 \le x3 \le 1$, $0 \le y1 \le 1$. The content of the element can be adjusted for different purposes, such as, but not limited to, adjusting the energy gap or the peak wavelength of the light emitted from the semiconductor device when the semiconductor device includes a light-emitting device.

In the following embodiments, wordings used to indicate directions, such as "up," "down," "front," "back," "left,", "on", 'under' and "right", merely refer to directions in the accompanying drawings. Therefore, the directional wording is used to illustrate rather than limit the present disclosure.

The compositions and dopants of each layer in the semiconductor device of the present disclosure can be determined by any suitable means, such as secondary ion mass spectrometer (SIMS).

The thickness of each layer in the semiconductor device of the present disclosure can be determined by any suitable means, such as transmission electron microscope (TEM) or scanning electron microscope (SEM) to determine the depth position of each layer on the SIMS graph.

The semiconductor device of the present disclosure includes a light-emitting device. The light-emitting device includes a light-emitting diode or a laser.

FIG. 1 is a schematic cross-sectional diagram of a first embodiment of a semiconductor device 1. In the present embodiment, the semiconductor device 1 includes a substrate 10, a first semiconductor layer 20 on the substrate 10, a second semiconductor layer 30 on the first semiconductor layer 20, an active region 40 between the second semiconductor layer 30 and the first semiconductor layer 20, a first In-containing layer 50 between the active region 40 and the second semiconductor layer 30, a second In-containing layer 60 between the first In-containing layer 50 and the second semiconductor layer 30, and an electron blocking structure 70 between the first In-containing layer 50 and the second In-containing layer 60. In the present embodiment, the first In-containing layer 50 is closer to the active region 40 than the second In-containing layer 60 is to the active region 40. The semiconductor device 1 further includes a first electrode 80 and a second electrode 90. The first electrode 80 is electrically connected to the second semiconductor layer 30. The second electrode 90 is electrically connected to the first semiconductor layer 20.

In one embodiment, the second In-containing layer 60 has an energy gap different form the energy gap of the first In-containing layer 50. In one embodiment, the first In-containing layer 50 has a first indium content, and the second In-containing layer 60 has a second indium content. The first indium content is different from the second indium content. In one embodiment, the first In-containing layer 50 includes $In_aAl_bGa_{1-a-b}N$, wherein $0 \le a \le 1$, $0 \le b \le 1$, the second In-containing layer 60 includes $In_cAl_dGa_{1-c-d}N$, wherein $0 \le c \le 1$, $0 \le d \le 1$, and $c \ne a$. In one embodiment, $0 < a \le 0.1$, $0 \le b \le 0.3$, $0 < c \le 0.2$, $0 \le d \le 0.3$, and $c \ne a$. The second In-containing layer 60 enhances hole injection efficiency and electrical static discharge (ESD) tolerance of the semiconductor device 1.

In one embodiment, the first In-containing layer 50 includes Al. In one embodiment, the second In-containing layer 60 includes Al. In one embodiment, both the first In-containing layer 50 and the second In-containing layer 60 include Al. The second In-containing layer 60 including Al further enhances the hole injection efficiency and improves ESD tolerance of the semiconductor device 1. In one embodiment, the first In-containing layer 50 includes a first Al content, and the second In-containing layer 60 includes a second Al content. The first Al content is different from the second Al content. Preferably, the first Al content is greater than the second Al content for improving the hole injection efficiency and reducing absorption of the light emitted from the active region 40 when the semiconductor device 1 includes a light-emitting device. In one embodiment, the first In-containing layer 50 includes $In_aAl_bGa_{1-a-b}N$, wherein $0<a\le1$, $0<b\le1$, the second In-containing layer 60 includes $In_cAl_dGa_{1-c-d}N$, wherein $0<c\le1$, $0<d\le1$, $c\ne a$, and $d<b$. In one embodiment, $0<a\le0.1$, $0<b\le0.3$, $0<c\le0.2$, $0<d\le0.3$, $c\ne a$, and $d<b$.

Referring to FIG. 1, in the present embodiment, the electron blocking structure 70 is in direct contact with the first In-containing layer 50. That is, there is no layer intervening between electron blocking structure 70 and the first In-containing layer 50. In the present embodiment, the second In-containing layer 60 has an energy gap greater than the energy gap of the first In-containing layer 50. In the present embodiment, the second indium content is less than the first indium content. In one embodiment, the first In-containing layer 50 includes $In_aAl_bGa_{1-a-b}N$, wherein $0<a\le1$, $0\le b\le1$, the second In-containing layer 60 includes $In_cAl_dGa_{1-c-d}N$, wherein $0<c\le1$, $0\le d\le1$, and $c<a$. In one embodiment, $0<a\le0.2$, $0\le b\le0.3$, $0<c\le0.1$, $0\le d\le0.3$, and $c<a$.

In one embodiment, the first In-containing layer 50 includes $In_aAl_bGa_{1-a-b}N$, wherein $0<a\le1$, $0<b\le1$, the second In-containing layer 60 includes $In_cAl_dGa_{1-c-d}N$, wherein $0<c\le1$, $0<d\le1$, and $c<a$, and $d\ne b$. In one embodiment, the first In-containing layer 50 includes $In_aAl_bGa_{1-a-b}N$, wherein $0<a\le1$, $0<b\le1$, the second In-containing layer 60 includes $In_cAl_dGa_{1-c-d}N$, wherein $0<c\le1$, $0<d\le1$, $c<a$, and $d<b$, wherein $d<b$ is for reducing light absorption. In one embodiment, $0<a\le0.2$, $0<b\le0.3$, $0<c\le0.1$, $0<d\le0.3$, $c<a$, and $d<b$.

Figure 2:
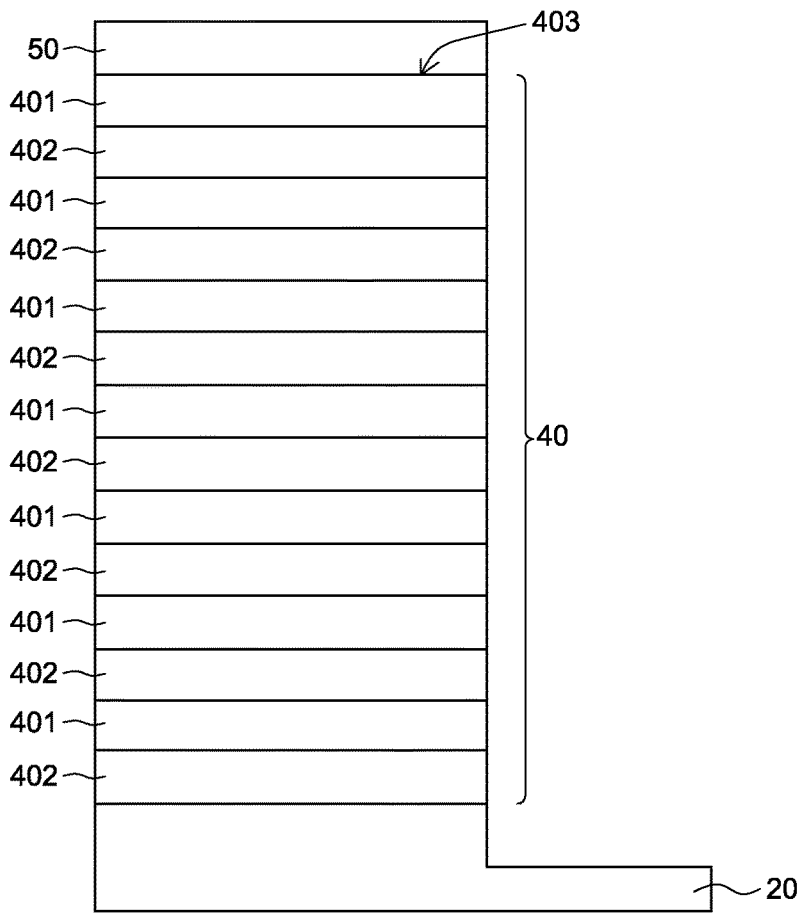
FIG. 2 is a schematic cross-sectional diagram of the active region of the first embodiment of a semiconductor device.

FIG. 2 is a schematic cross-sectional diagram of the active region 40 of the first embodiment of a semiconductor device 1. In the present embodiment, the active region 40 includes alternating well layers 401 and barrier layers 402. Each barrier layer 402 has a first energy gap. Each well layer 401 has a second energy gap. In one embodiment, the first energy gap of one of the barrier layers 402 is not less than the second energy gap of one of the well layers 401, and preferably, is higher than the second energy gap of one of the well layers 401. Preferably, the first energy gap of each barrier layer 402 is not less than the second energy gap of each well layer 401, and preferably, is higher than the second energy gap of each of the well layers 401. A single well layer 401 and a single adjacent barrier layer 402 are regarded as a pair. The pair number of the well layers 401 and the barrier layers 402 is not less than 4, and preferably is not more than 15.

In one embodiment, the well layers 401 include Group III-V semiconductor material. In one embodiment, the well layers 401 include $Al_yIn_zGa_{1-y-z}N$, wherein $0\le y\le0.4$, $0<z\le1$. In the present embodiment, the well layers 401 include $In_eGa_{1-e}N$, wherein $0<e<1$. Each of the well layers 401 has a third indium content.

In one embodiment, the first In-containing layer 50, the second In-containing layer 60 and the second semiconductor layer 30 each includes a dopant, and preferably, includes a p-type dopant. The p-type dopant, may include, but not limited to Mg. In one embodiment, the concentration of the p-type dopant of the first In-containing layer 50 is not less than $1\times10^{18}/cm^3$, and preferably, not less than $5\times10^{18}/cm^3$, and more preferably, not more than $1\times10^{20}/cm^3$. In one embodiment, the concentration of the p-type dopant of the second In-containing layer 60 is not less than $1\times10^{18}/cm^3$, and preferably, not less than $5\times10^{18}/cm^3$, and more preferably, not more than $1\times10^{20}/cm^3$.

Referring to FIG. 1, in the present embodiment, the active region 40 includes an upper surface 403 facing the first In-containing layer 50. A first distance between the first In-containing layer 50 and the upper surface 403 of the active region 40 is not more than 15 nm, and preferably, between 2 nm and 10 nm both inclusive. If the first distance between the first In-containing layer 50 and the upper surface 403 of the active region 40 is less than 2 nm, the amount of the p-type dopant diffusing into the active region 40 will increase. Therefore, the ESD tolerance of the semiconductor device 1 is deteriorated. If the first distance between the first In-containing layer 50 and the upper surface 403 of the active region 40 is more than 15 nm, the hole injection efficiency will reduce. Therefore, the brightness of the semiconductor device 1 will be worse.

In one embodiment, a ratio of the third indium content of one of the well layers 401 to the second indium content of the second In-containing layer 60 is between 20 and 1200 both inclusive, and preferably between 20 and 500 both inclusive, and more preferably, between 25 and 150 both inclusive.

In one embodiment, the barrier layers 402 includes $Al_fGa_{1-f}N$, wherein $0\le f\le1$. In another embodiment, $0<f\le0.6$. In the present embodiment, the barrier layers 402 include GaN.

In one embodiment, at least two of the barrier layers 402 include an n-type dopant. The n-type dopant includes, but is not limited to, Si. The concentration of the n-type dopant of the barrier layers 402 is greater than $5\times10^{16}/cm^3$, and preferably, is greater than $1\times10^{17}/cm^3$, and more preferably, is not more than $1\times10^{18}/cm^3$. If the concentration of the n-type dopant of the barrier layers 402 is greater than $1\times10^{18}/cm^3$, the brightness of the semiconductor device 1 will be worse. In one embodiment, the concentration of the n-type dopant of one of the barrier layers 402 is different from the concentration of the n-type dopant of other barrier layers 402. In one embodiment, to reduce the forward voltage of the semiconductor device 1, at least the concentration of the n-type dopant of the barrier layer 402 closest to the first In-containing layer 50 is greater than the concentration of the n-type dopant of two of the barrier layers 402 closer to the first semiconductor layer 20. In one embodiment, to reduce the forward voltage of the semiconductor device 1, the concentrations of the n-type dopants of at least two consecutive barrier layers 402 closer to the first In-containing layer 50 is greater than the concentrations of the n-type dopants of two consecutive barrier layers 402 closer to the first semiconductor layer 20. Referring to FIG. 2, in the present embodiments, the pair number of the well layers 401 and the barrier layers 402 is 7. Each of the barrier layers 402 includes an n-type dopant. The concentrations $C_1$ of the n-type dopants of three consecutive barrier layers 402 closer to the first In-containing layer 50 are higher than the concentrations $C_2$ of the n-type dopants of other barrier layers 402 closer to the first semiconductor layer 20. Preferably, a ratio of $C_1$ to $C_2$ is not less than 1.2, and preferably, is not more than 1.8.

In the present embodiment, each of the barrier layers 402 has a thickness not less than the thickness of one of the well layers 401. Preferably, the thickness of each barrier layer 402 is not less than the thickness of each of the well layers 401. Preferably, the thickness of each of the barrier layers 402 is not less than 3 nm, and more preferably, is not more than 15 nm. The thickness of each of the well layers 401 is not less than 1 nm, and more preferably, is not more than 5 nm. In one embodiment, the well layer 401 closest to the first In-containing layer 50 includes the upper surface 403.

In one embodiment, the first In-containing layer 50 has a thickness not less than 3 nm, preferably, not more than 50 nm, and more preferably, between 5 nm and 35 nm both inclusive. If the thickness of the first In-containing layer 50 is more than 35 nm, the brightness of the semiconductor device 1 will be worse. If the thickness of the first In-containing layer 50 is less than 3 nm, the ESD tolerance will deteriorate. In the present embodiment, the electron blocking structure 70 is directly on the first In-containing layer 50. In other words, the first In-containing layer 50 is in direct contact with the electron blocking structure 70. The first In-containing layer 50 has a thickness between 25 nm and 35 nm both inclusive.

The second In-containing layer 60 has a thickness between 30 nm and 70 nm both inclusive, and preferably between 40 nm and 60 nm both inclusive. The second In-containing layer 60 with a thickness greater than 70 nm increases the forward voltage of the semiconductor device 1. If the thickness of the second In-containing layer 60 is less than 30 nm, the electrical static discharge (ESD) tolerance of the semiconductor device 1 will deteriorate.

In one embodiment, the second In-containing layer 60 includes a bottom surface 601 and a top surface 602 opposite to the bottom surface 601, wherein the bottom surface 601 faces the first In-containing layer 50. That is, the bottom surface 601 is closer to the first In-containing layer 50 than the top surface 602 is to the first In-containing layer 50. A second distance between the bottom surface 601 of the second In-containing layer 60 and the upper surface 403 of the active region 40 is not less than 40 nm, and preferably between 50 nm and 80 nm both inclusive. If the second distance is less than 40 nm and the thickness of the second In-containing layer 60 is less than 30 nm, the top surface 602 of the second In-containing layer 60 is not smooth enough for epitaxially good quality of the second semiconductor layer 30 formed thereon, which leads to a poor performance of the semiconductor device 1.

Referring to FIG. 1, in one embodiment, the semiconductor device 1 includes a topmost semiconductor surface 31 on the second In-containing layer 60. In the present embodiment, the second semiconductor layer 30 includes the topmost semiconductor surface 31. The topmost semiconductor surface 31 is the surface in direct contact with the first electrode 80. To improve brightness and the electrical static discharge tolerance at the same time, a third distance between the bottom surface 601 of the second In-containing layer 60 and the topmost semiconductor surface 31 is not less than 40 nm, and not more than 80 nm.

In one embodiment, the electron blocking structure 70 include a third semiconductor layer (not shown) with a thickness between 15 nm and 60 nm both inclusive. The energy gap of the third semiconductor layer is greater than the energy gap of one of the barrier layers 402, and preferably, is greater than the energy gap of each of the barrier layers 402. In one embodiment, the energy gap of the third semiconductor layer is greater than both of the energy gap of the first In-containing layer 50 and the energy gap of the second In-containing layer 60.

In the present embodiment, the electron blocking structure 70 includes alternating third semiconductor layers (not shown) and fourth semiconductor layers (not shown), wherein the energy gap of each of the third semiconductor layers is greater than the energy gap of one of the fourth semiconductor layers. More preferably, the energy gap of each of the third semiconductor layers is greater than the energy gap of each of the fourth semiconductor layers. In one embodiment, the energy gap of one the third semiconductor layers is greater than the energy gap of one of the barrier layers 402, and preferably, is greater than the energy gap of each of the barrier layers 402. Preferably, the energy gap of each of the third semiconductor layers is greater than the energy gap of each of the barrier layers 402. In the present embodiment, the energy gap of one of the third semiconductor layers is greater than both of the energy gap of the first In-containing layer 50 and the energy gap of the second In-containing layer 60. Preferably, the energy gap of each of the third semiconductor layers is greater than both the energy gap of the first In-containing layer 50 and the energy gap of the second In-containing layer 60. The thickness of one of the third semiconductor layers is less than the thickness of one of the fourth semiconductor layers. Preferably, the thickness of each of the third semiconductor layers is less than the thickness of each of the fourth semiconductor layers. The thickness of one of the third semiconductor layers is between 1.5 nm and 5 nm both inclusive. Preferably, the thickness of each of the third semiconductor layers is between 1.5 nm and 5 nm both inclusive. The thickness of one of the fourth semiconductor layers is between 2 nm and 5 nm both inclusive. Preferably, the thickness of each of the fourth semiconductor layers is between 2 nm and 5 nm both inclusive. The thickness of the electron blocking structure 70 is between 20 nm and 60 nm both inclusive.

In one embodiment, the third semiconductor layers include $In_gAl_hGa_{1-g-h}N$, wherein $0 \leq g \leq 1$, $0 \leq h \leq 1$, preferably, $0 \leq g \leq 0.005$, $0 < h \leq 0.5$, and preferably, $h > d$, wherein the second In-containing layer 60 includes $In_cAl_dGa_{1-c-d}N$. The fourth semiconductor layers include $In_iAl_jGa_{1-i-j}N$, wherein $0 \leq i \leq 1$, $0 \leq j \leq 1$. Preferably, $h > j$. In one embodiment, $j=0$. In one embodiment, one of the fourth semiconductor layers includes a fourth indium content. The fourth indium content is greater than the second indium content of the second In-containing layer 60. In the present embodiment, each of the fourth semiconductor layers includes a fourth indium content. Each of the fourth indium content is greater than the second indium content of the second In-containing layer 60. In one embodiment, the fourth semiconductor layers include GaN. In one embodiment, a single third semiconductor layer and a single fourth semiconductor layer adjacent to the single third semiconductor layer are considered as a pair. The pair number of the third semiconductor layers and the fourth semiconductor layers is not less than 3, and more preferably, not more than 15, and preferably, is between 5 and 10 both inclusive. In the present embodiment, the materials of the third semiconductor layers are substantially the same. The materials of the fourth semiconductor layers are substantially the same. The alternating third semiconductor layers and fourth semiconductor layers may further improve the brightness of the semiconductor device 1.

In one embodiment, the electron blocking structure 70 includes a dopant, and preferably, includes a p-type dopant. The p-type dopant, may include, but not limited to Mg. Preferably, to reduce the absorption of the radiation emitted from the active region 40, the concentration of the p-type dopant of the second In-containing layer 60 is less than the concentration of the p-type dopant of the electron blocking structure 70. The concentration of the p-type dopant of the electron blocking structure 70 is not less than $5\times10^{18}/cm^3$, and preferably, not less than $1\times10^{19}/cm^3$, and more preferably, between $3\times10^{19}/cm^3$ and $1\times10^{21}/cm^3$ both inclusive. In one embodiment, the concentration of the p-type dopant of the first In-containing layer 50 is between that of the electron blocking structure 70 and that of the second In-containing layer 60.

In one embodiment, the distance between the upper surface 403 of the active region 40 and the topmost semiconductor surface 31 is not more than 140 nm, and preferably between 50 nm and 130 nm both inclusive. The semiconductor device 1 of the present embodiment can be more compact, and with improved brightness and electrical static discharge tolerance at the same time.

Figure 3:
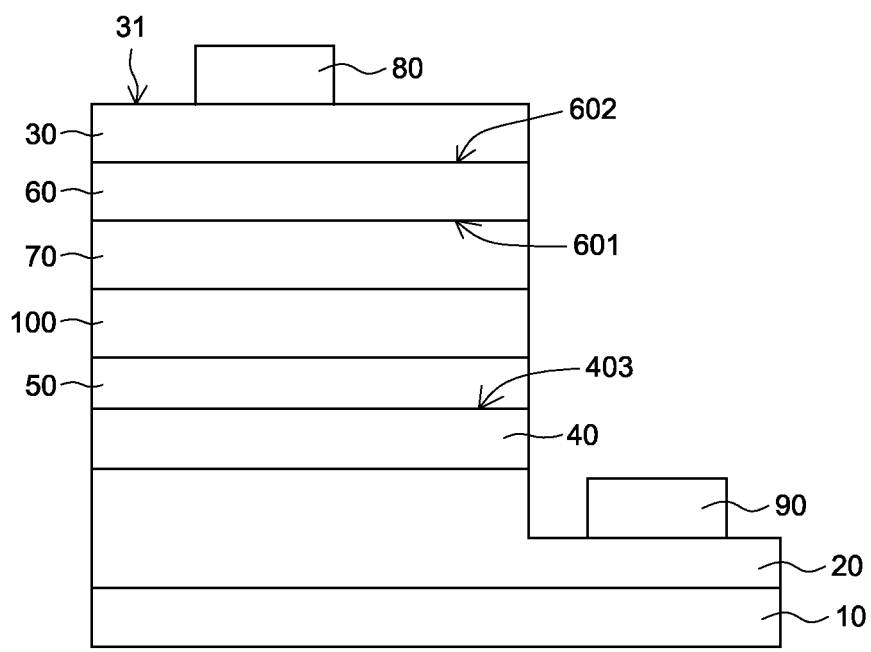
FIG. 3 is a schematic cross-sectional view of a second embodiment of the semiconductor device.

FIG. 3 is a schematic cross-sectional view of a second embodiment of the semiconductor device 2. The semiconductor device 2 in accordance with the second embodiment of the present disclosure includes substantially the same structure as that of the first embodiment. The difference between the first embodiment and the second embodiment is described below. In the present embodiment, a fifth semiconductor layer 100 is between the electron blocking structure 70 and the first In-containing layer 50. The fifth semiconductor layer 100 includes $In_sAl_pGa_{1-s-p}N$, wherein $0\leq s\leq 1$, $0\leq p\leq 1$, Preferably, the fifth semiconductor layer 100 includes GaN. The thickness of the fifth semiconductor layer 100 is between 10 nm and 40 nm both inclusive. Preferably, the fifth semiconductor layer 100 includes a dopant, and preferably, includes a p-type dopant. The p-type dopant includes, but is not limited to, Mg. Preferably, the concentration of the p-type dopant of the fifth semiconductor layer 100 is less than the concentration of the p-type dopant of the electron blocking structure 70. The concentration of the p-type dopant of the fifth semiconductor layer 100 is not less than $5\times10^{18}/cm^3$, and preferably, not more than $1\times10^{21}/cm^3$.

In the present embodiment, the first In-containing layer 50 has a thickness between 5 nm and 10 nm both inclusive. In the present embodiment, the electron blocking structure 70 is in direct contact with the fifth semiconductor layer 100. In the present embodiment, the second In-containing layer 60 has an energy gap less than the energy gap of the first In-containing layer 50. In the present embodiment, the second indium content is greater than the first indium content. In one embodiment, the first In-containing layer 50 includes $In_aAl_bGa_{1-a-b}N$, wherein $0<a\leq 1$, $0\leq b\leq 1$, the second In-containing layer 60 includes $In_cAl_dGa_{1-c-d}N$, wherein $0<c\leq 1$, $0\leq d\leq 1$, and $c>a$. In one embodiment, $0<a\leq 0.1$, $0\leq b\leq 0.3$, $0<c\leq 0.2$, $0\leq d\leq 0.3$, and $c>a$. In one embodiment, the first In-containing layer 50 includes $In_aAl_bGa_{1-a-b}N$, wherein $0<a\leq 1$, $0<b\leq 1$, the second In-containing layer 60 includes $In_cAl_dGa_{1-c-d}N$, wherein $0<c<1$, $0<d\leq 1$, $c>a$, and $d\neq b$. In one embodiment, the first In-containing layer 50 includes $In_aAl_bGa_{1-a-b}N$, wherein $0<a\leq 1$, $0<b\leq 1$, the second In-containing layer 60 includes $In_cAl_dGa_{1-c-d}N$, wherein $0<c\leq 1$, $0<d\leq 1$, $c>a$, and $d<b$, wherein $d<b$ is for reducing light absorption. In one embodiment, $0<a\leq 0.1$, $0<b\leq 0.3$, $0<c\leq 0.2$, $0<d\leq 0.3$, $c>a$, and $d<b$.

In the present disclosure, the second semiconductor layer 30 of any one of the embodiments of the semiconductor device includes a contact layer including a p-type dopant. The concentration of the p-type dopant of the contact layer is greater than the concentration of the p-type dopant of the electron blocking structure 70. Preferably, the concentration of the p-type dopant of the contact layer is not less than $1\times10^{18}/cm^3$, and preferably, not less than $1\times10^{19}/cm^3$, and more preferably, between $1\times10^{19}/cm^3$ and $5\times10^{22}/cm^3$ both inclusive. The material of the contact layer includes a Group III-V semiconductor material, such as $Al_mGa_{1-m}N$, wherein $0\leq m\leq 1$. In one embodiment, $0<m<0.1$, and preferably, $0<m<0.05$. If the contact layer includes Al, the brightness of the semiconductor device of the present disclosure will be higher. In another embodiment, the contact layer includes GaN. The contact layer has a thickness not more than 15 nm, and preferably, not less than 3 nm.

In the present disclosure, the first semiconductor layer 20 of any one of the embodiments of the semiconductor device includes $Al_qGa_{1-q}N$, wherein $0\leq q\leq 1$. Preferably, the first semiconductor layer 20 includes GaN and an n-type dopant. The first semiconductor layer 20 has a thickness not less than 100 nm, and preferably not more than 3000 nm. The concentration of the n-type dopant of the first semiconductor layer 20 is not less than $1\times10^{18}/cm^3$, and preferably, not less than $5\times10^{18}/cm^3$, and more preferably, between $5\times10^{18}/cm^3$ and $5\times10^{21}/cm^3$ both inclusive. The n-type dopant includes, but is not limited to Si.

In the present disclosure, any one of the embodiments of the semiconductor device further includes a buffer layer (not shown) between the substrate 10 and the first semiconductor layer 20. The buffer layer is for reducing dislocations and improving quality of the layers formed by epitaxial growth thereon. In one embodiment, the buffer layer includes $Al_iGa_{1-i}N$, wherein $0\leq i\leq 1$. In one embodiment, the buffer layer includes GaN. In another embodiment, the buffer layer 20 includes AlN. The buffer layer may be formed by physical vapor deposition (PVD) or epitaxy. The PVD includes sputtering or E-gun evaporation.

In the present disclosure, the substrate 10 of any one of the embodiments of the semiconductor device has a thickness thick enough for supporting the layers or structures thereon, for example, not less than 50 μm, and more preferably, not more than 300 μm. In one embodiment, the substrate 10 includes sapphire with protrusions periodically formed on a surface thereof. In another embodiment, the substrate 10 includes conductive material including Si, Ge, Cu, Mo, MoW, GaN, ZnO or CuW.

In the present disclosure, the first electrode 80 and the second electrode 90 of any one of the embodiments of the semiconductor device are for electrically connecting to an external power source and for conducting a current therebetween. The material of the first electrode 80 and the second electrode 90 include transparent conductive material or metal material, wherein the transparent conductive material includes transparent conductive oxide including indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide(GZO), tungsten doped indium oxide (IWO), zinc oxide (ZnO), or indium zinc oxide (IZO). The metal material includes Au, Pt, GeAuNi, Ti, BeAu, GeAu, Al, or ZnAu, Ni.

In one embodiment, the first electrode 80 and the second electrode 90 may be on the two opposite sides of the substrate 10 respectively. In the present embodiment, the substrate 10 may include conductive material.

The method of performing epitaxial growth includes, but is not limited to, metal-organic chemical vapor deposition (MOCVD), hydride vapor phase epitaxy (HYPE), molecular beam epitaxy (MBE), or liquid-phase epitaxy (LPE). Preferably, the method includes MOCVD.

When any one of the embodiments of the semiconductor device of the present disclosure includes a light emitting device, the peak wavelength of the light emitted from the light emitting device is in a visible or invisible range, and preferably, in a blue or ultraviolet range. Preferably, the peak wavelength is between 250 nm and 570 nm both inclusive, and preferably, between 350 nm and 480 nm both inclusive.

In accordance with a further embodiment of the present disclosure, the structures in the embodiments of the present disclosure can be combined or changed. For example, the electron blocking structure 70 of semiconductor device 2 as shown in FIG. 3 includes include a third semiconductor layer with a thickness between 15 nm and 60 nm as described in the present disclosure.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A semiconductor device, comprising:
a first semiconductor layer;
a second semiconductor layer on the first semiconductor layer;
an active region between the second semiconductor layer and the first semiconductor layer;
an electron blocking structure between the active region and the second semiconductor layer;
a first In-containing layer between the active region and the electron blocking structure; and
a second In-containing layer between the electron blocking structure and the second semiconductor layer;
wherein the first In-containing layer and the second In-containing layer each comprises indium, aluminum and gallium, the first In-containing layer has a first aluminum content, the second In-containing layer has a second aluminum content, and the second aluminum content is less than the first aluminum content.

2. The semiconductor device according to claim 1, wherein the first In-containing layer has a first indium content, the second In-containing layer has a second indium content, and the second indium content is different from the first indium content.

3. The semiconductor device according to claim 2, wherein the electron blocking structure is in direct contact with the first In-containing layer, and the second indium content is less than the first indium content.

4. The semiconductor device according to claim 3, wherein the second In-containing layer has an energy gap greater than an energy gap of the first In-containing layer.

5. The semiconductor device according to claim 2, wherein the electron blocking structure and the first In-containing layer sandwich an intermediate layer, and the second indium content is greater than the first indium content.

6. The semiconductor device according to claim 5, wherein the second In-containing layer has an energy gap less than an energy gap of the first In-containing layer.

7. The semiconductor device according to claim 1, wherein the electron blocking structure comprises a third semiconductor layer having an energy gap, the active region comprises alternating well layers and barrier layers, and the energy gap of the third semiconductor layer is greater than an energy gap of one of the barrier layers.

8. The semiconductor device according to claim 7, wherein the energy gap of the third semiconductor layer is greater than both of an energy gap of the first In-containing layer and an energy gap of the second In-containing layer.

9. The semiconductor device according to claim 1, wherein the electron blocking structure and the second In-containing layer each comprises a dopant having a concentration, the concentration of the dopant of the second In-containing layer is less than the concentration of the dopant of the electron blocking structure.

10. The semiconductor device according to claim 9, wherein the first In-containing layer comprises a dopant having a concentration, wherein the concentration of the dopant of the first In-containing layer is between the concentration of the dopant of the electron blocking structure and the concentration of the dopant of the second In-containing layer.

11. The semiconductor device according to claim 9, wherein the dopant of the electron blocking structure comprises Mg.

12. The semiconductor device according to claim 9, wherein the concentration of the dopant of the electron blocking structure is not less than $5 \times 10^{18}/cm^3$.

13. The semiconductor device according to claim 9, wherein the concentration of the dopant of the second In-containing layer is not more than $1 \times 10^{20}/cm^3$.

14. The semiconductor device according to claim 2, wherein the electron blocking structure comprises alternating third semiconductor layers and fourth semiconductor layers.

15. The semiconductor device according to claim 14, wherein one of the fourth semiconductor layers includes a fourth indium content, the fourth indium content is greater than the second indium content of the second In-containing layer.

16. The semiconductor device according to claim 14, wherein one of the third semiconductor layers and one of the fourth semiconductor layers adjacent to the one of the third semiconductor layers are considered as a pair, a pair number of the third semiconductor layers and the fourth semiconductor layers is not less than 3.

17. The semiconductor device according to claim 14, wherein a thickness of the electron blocking structure is between 20 nm and 60 nm both inclusive.

18. The semiconductor device according to claim 14, wherein the electron blocking structure and the first In-containing layer sandwich an intermediate layer.

19. The semiconductor device according to claim 14, wherein a thickness of one of the third semiconductor layers is less than a thickness of one of the fourth semiconductor layers.

20. The semiconductor device according to claim 19, wherein the thickness of one of the third semiconductor layers is between 1.5 nm and 5 nm both inclusive, and the thickness of one of the fourth semiconductor layers is between 2 nm and 5 nm both inclusive.

* * * * *